(12) United States Patent
Endo et al.

(10) Patent No.: US 12,302,662 B2
(45) Date of Patent: May 13, 2025

(54) PHOTOELECTRIC CONVERSION APPARATUS AND SYSTEM

(71) Applicant: CANON KABUSHIKI KAISHA, Tokyo (JP)

(72) Inventors: Nobuyuki Endo, Fujisawa (JP); Tetsuya Itano, Sagamihara (JP); Kazuo Yamazaki, Yokohama (JP); Kyouhei Watanabe, Yokohama (JP); Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/587,589

(22) Filed: Feb. 26, 2024

(65) Prior Publication Data
US 2024/0194715 A1 Jun. 13, 2024

Related U.S. Application Data

(63) Continuation of application No. 18/184,471, filed on Mar. 15, 2023, now Pat. No. 11,942,501, which is a continuation of application No. 17/234,614, filed on Apr. 19, 2021, now Pat. No. 11,637,141, which is a continuation of application No. 16/789,944, filed on
(Continued)

(30) Foreign Application Priority Data

Dec. 26, 2009 (WO) .................. PCT/JP2009/071703

(51) Int. Cl.
| | | |
|---|---|---|
| H10F 39/00 | (2025.01) | |
| H04N 25/76 | (2023.01) | |
| H04N 25/767 | (2023.01) | |
| H10F 39/12 | (2025.01) | |

(Continued)

(52) U.S. Cl.
CPC .......... H10F 39/809 (2025.01); H04N 25/76 (2023.01); H04N 25/767 (2023.01); H10F 39/018 (2025.01); H10F 39/026 (2025.01); H10F 39/182 (2025.01); H10F 39/199 (2025.01); H10F 39/8037 (2025.01); H10F 39/8057 (2025.01); H10F 39/8063 (2025.01); H10F 39/807 (2025.01); H10F 39/811 (2025.01);
(Continued)

(58) Field of Classification Search
CPC ......... H01L 27/14634; H01L 27/14612; H01L 27/14623; H01L 27/14627; H01L 27/1463; H01L 27/14632; H01L 27/14636; H01L 27/1464; H01L 27/14645; H01L 27/14687; H01L 27/1469; H01L 31/02; H01L 2224/80895; H01L 2224/80896; H01L 2224/8034; H01L 27/146; H04N 25/76; H04N 25/767; H04N 25/00
See application file for complete search history.

(56) References Cited

U.S. PATENT DOCUMENTS

| | | | |
|---|---|---|---|
| 8,404,576 B2 * | 3/2013 | Cha | H01L 29/42324 |
| | | | 438/257 |
| 11,942,501 B2 * | 3/2024 | Endo | H01L 27/1469 |
| 2008/0048277 A1 * | 2/2008 | Kim | H10D 84/0179 |
| | | | 257/E21.624 |

* cited by examiner

*Primary Examiner* — Seung C Sohn
(74) *Attorney, Agent, or Firm* — Canon U.S.A., Inc. IP Division

(57) ABSTRACT

An apparatus according to the present invention in which a first substrate including a photoelectric conversion element and a gate electrode of a transistor, and a second substrate including a peripheral circuit portion are placed upon each other. The first substrate does not include a high-melting-
(Continued)

metal compound layer, and the second substrate includes a high-melting-metal compound layer.

29 Claims, 13 Drawing Sheets

Related U.S. Application Data

Feb. 13, 2020, now Pat. No. 11,011,565, which is a continuation of application No. 15/851,354, filed on Dec. 21, 2017, now Pat. No. 10,608,034, which is a continuation of application No. 15/237,458, filed on Aug. 15, 2016, now Pat. No. 9,881,958, which is a continuation of application No. 14/861,985, filed on Sep. 22, 2015, now Pat. No. 9,443,895, which is a continuation of application No. 13/898,264, filed on May 20, 2013, now Pat. No. 9,178,081, which is a continuation of application No. 12/975,088, filed on Dec. 21, 2010, now Pat. No. 8,466,403.

(51) Int. Cl.
*H10F 39/18* (2025.01)
*H10F 77/00* (2025.01)

(52) U.S. Cl.
CPC .... *H10F 77/00* (2025.01); *H01L 2224/80895* (2013.01); *H01L 2224/80896* (2013.01)

PHOTOELECTRIC CONVERSION APPARATUS AND SYSTEM

CROSS-REFERENCE TO RELATED APPLICATION

This application is a Continuation of U.S. application Ser. No. 18/184,471, filed Mar. 15, 2023; which is a Continuation of U.S. application Ser. No. 17/234,614, filed Apr. 19, 2021, now becomes U.S. Pat. No. 11,637,141 issued Apr. 25, 2023; which is a Continuation of U.S. application Ser. No. 16/789,944, filed Feb. 13, 2020, now becomes U.S. Pat. No. 11,011,565 issued May 18, 2021; which is a Continuation of U.S. application Ser. No. 15/851,354, filed Dec. 21, 2017, now becomes U.S. Pat. No. 10,608,034 issued Mar. 31, 2020; which is a Continuation of U.S. application Ser. No. 15/237,458, filed Aug. 15, 2016, now becomes U.S. Pat. No. 9,881,958 issued Jan. 30, 2018; which is a Continuation of U.S. application Ser. No. 14/861,985, filed Sep. 22, 2015, now becomes U.S. Pat. No. 9,443,895 issued Sep. 13, 2016; which is a Continuation of U.S. application Ser. No. 13/898,264, filed May 20, 2013, now becomes U.S. Pat. No. 9,178,081 issued Nov. 3, 2015; which is a Continuation of U.S. application Ser. No. 12/975,088, filed Dec. 21, 2010, now becomes U.S. Pat. No. 8,466,403 issued Jun. 18, 2013, which claims priority from International Application No. PCT/JP2009/071703, filed Dec. 26, 2009, which are hereby incorporated by reference herein in their entireties.

TECHNICAL FIELD

The present invention relates to a backside-illumination solid-state image pickup apparatus.

BACKGROUND ART

Recent higher-speed solid-state image pickup apparatuses have caused the proposal of a structure in which a semiconductor compound layer is provided at a transistor.

Japanese Patent Laid-Open No. 2001-111022 discusses a solid-state image pickup apparatus in which a high-melting-metal semiconductor compound layer is not provided on a photodetector of a photoelectric converting section, and a high-melting-metal semiconductor compound layer is provided at a peripheral circuit portion.

Japanese Patent Laid-Open No. 2009-170448 discusses a backside-illumination solid-state image pickup apparatus in which, in order to increase sensitivity of a photoelectric conversion element, a substrate including a pixel portion provided with the photoelectric conversion element and a signal-readout circuit, and a substrate including a peripheral circuit for processing a read-out signal by driving the circuit of the pixel portion are adhered to each other.

In the structure in which a high-melting-metal semiconductor compound layer is provided at the peripheral circuit portion in Japanese Patent Laid-Open No. 2001-111022, since a high-melting metal is provided on the same substrate, the high-melting metal may be diffused to the photoelectric conversion element. Even if a surface of the photoelectric conversion element is protected by an insulating film, the high-melting metal may become diffused in the insulating film since, for example, a step of forming the high-melting metal on the insulating film exists. In addition, for example, a white defect may occur in an image due to leakage current generated as a result of contamination of the photoelectric conversion element by the high-melting metal. Further, in order to form the structure discussed in Japanese Patent Laid-Open No. 2001-111022, it is necessary to determine where to form the high-melting metal semiconductor compound layer on the same substrate, thereby complicating the process.

Accordingly, it is an object of the present invention to provide, by using a simple structure, a solid-state image pickup apparatus in which a high-melting-metal compound layer is disposed at a peripheral circuit portion while a reduction in the characteristics of a photoelectric conversion element, which causes, for example, a white defect to be produced, is suppressed.

SUMMARY OF INVENTION

The present invention provides an apparatus in which a first substrate and a second substrate are placed upon each other, the first substrate being where a photoelectric conversion element and a gate electrode for transferring an electric charge from the photoelectric conversion element are disposed, the second substrate being where a peripheral circuit portion for reading out a signal based on the electric charge generated at the photoelectric conversion element is disposed, wherein the second substrate is provided with a high-melting-metal compound layer, and the first substrate is not provided with a high-melting-metal compound layer.

Further features of the present invention will become apparent from the following description of exemplary embodiments with reference to the attached drawings.

DESCRIPTION OF EMBODIMENTS

Figure 1:
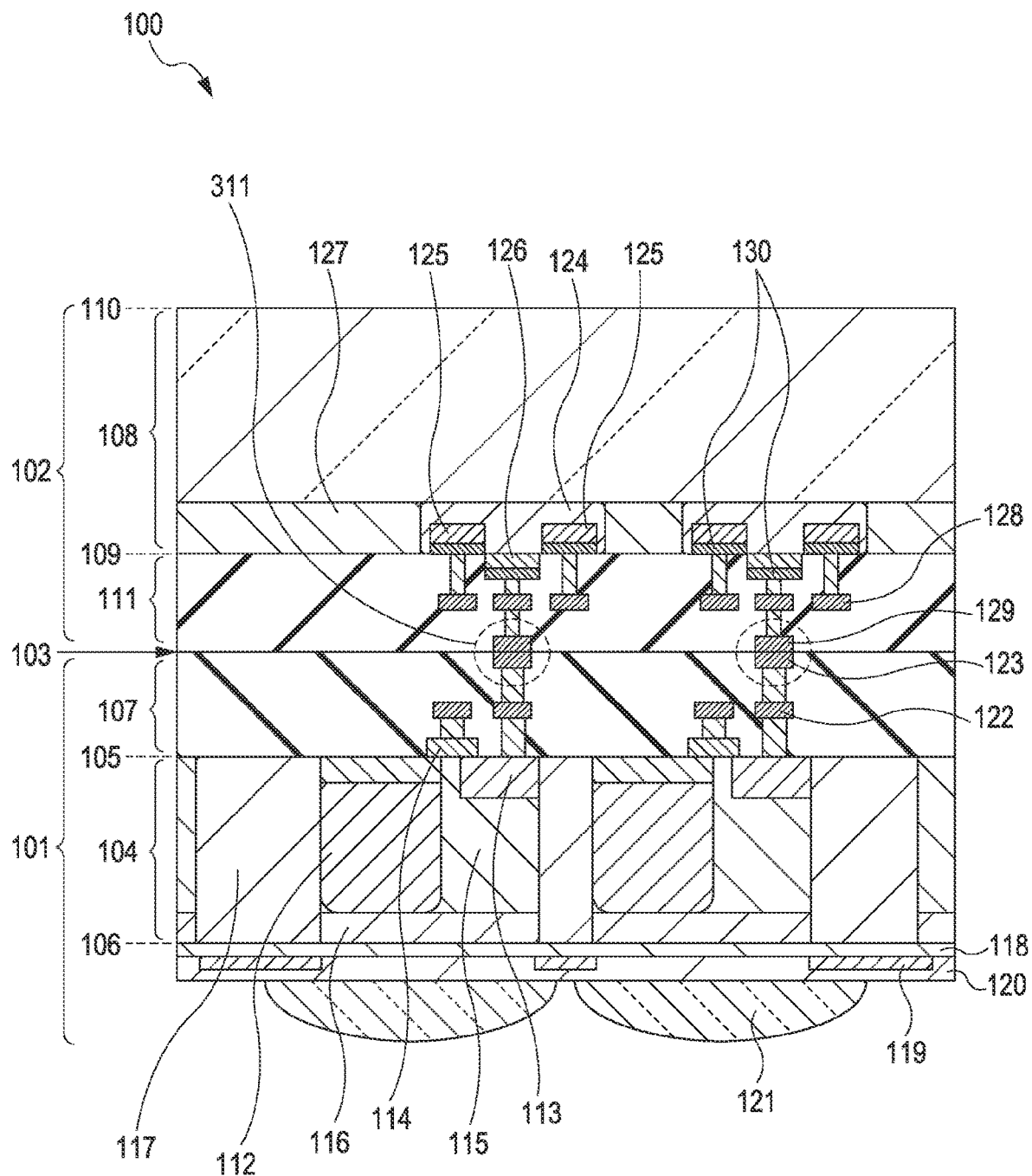
FIG. 1 is a sectional view of a solid-state image pickup apparatus used to describe a first embodiment.

A solid-state image pickup apparatus according to the present invention is formed by placing a first substrate and a second substrate upon each other, with the first substrate being provided with a photoelectric conversion element and a gate electrode for transfer and the second substrate being provided with a peripheral circuit portion. A high-melting-metal compound layer is not provided at the first substrate, whereas a high-melting-metal compound layer is provided at the second substrate. By such a structure, it becomes easier to determine where to form the compound layer, and it becomes possible for a transistor at the peripheral circuit portion to operate at a higher speed, and a signal readout operation to be performed at a high speed while suppressing a reduction in the characteristics of the photoelectric conversion element.

The present invention will hereunder be described in detail with reference to the drawings.

First Embodiment

A first embodiment of the present invention will be described with reference to FIGS. 1 and 12.

First, an exemplary circuit of a solid-state image pickup apparatus according to the first embodiment will be described with reference to FIG. 12. A solid-state image pickup apparatus 300 shown in FIG. 12 includes a pixel portion 301, in which a plurality of photoelectric conversion elements are arranged, and a peripheral circuit portion 302, provided with a control circuit for performing a driving operation for reading out a signal from the pixel portion 301 and with a signal processing circuit that processes the readout signal.

In the pixel portion 301, a plurality of photoelectric conversion elements 303, transfer transistors 304, amplification transistors 306, and reset transistors 307 are disposed. A structure including at least one photoelectric conversion element 303 is defined as a pixel. One pixel in the embodiment includes the photoelectric conversion element 303, the transfer transistor 304, the amplification transistor 306, and the reset transistor 307. A source of the transfer transistor 304 is connected to the photoelectric conversion element 303, and a drain region of the transfer transistor 304 is connected to a gate electrode of the amplification transistor 306. A node corresponding to the gate electrode of the amplification transistor 306 is defined as a node 305. The reset transistor is connected to the node 305, and an electric potential of the node 305 is set to any electric potential (for example, a reset electric potential). Here, the amplification transistor 306 is a portion of a source follower circuit, and a signal corresponding to the electric potential of the node 305 is output to a signal line RL.

The peripheral circuit portion 302 includes a vertical scanning circuit VSR for supplying a control signal to the gate electrode of the transistor of the pixel portion 301. The peripheral circuit portion 302 includes a readout circuit RC holding a signal output from the pixel portion 301 and including a signal processing circuit for amplification, addition, AD conversion, etc. In addition, the peripheral circuit portion 302 includes a horizontal scanning circuit HSR of a control circuit that controls timing with which signals from the readout circuit RC are successively output.

Here, the solid-state image pickup apparatus 300 according to the first embodiment is formed by placing two chips upon each other. The two chips are a first chip 308 including a photoelectric conversion element 303 and a transfer transistor 304 of the pixel portion 301, and a second chip 309 including an amplification transistor 306 and a reset transistor 307 of the pixel portion 301 and the peripheral circuit portion 302. In such a structure, a control signal is supplied to the gate electrode of the transfer transistor 304 of the first chip 308 from the peripheral circuit portion 302 of the second chip 309 through a connection portion 310. A signal generated at the photoelectric conversion element 303 of the first chip 308 is read out to the node 305 through a connection portion 311 connected to the drain region of the transfer transistor 304. By providing the reset transistor 307 and the amplification transistor 306 at a different chip in this way, it is possible to increase the area of the photoelectric conversion element 303, and to increase sensitivity. If the area of the photoelectric conversion element 303 is the same, many photoelectric conversion elements 303 can be provided, thereby making it possible to increase the number of pixels.

Next, a solid-state image pickup apparatus according to an embodiment will be described with reference to FIG. 1. FIG. 1 is a sectional view of a solid-state image pickup apparatus 100 corresponding to the solid-state image pickup apparatus 300 shown in FIG. 12. FIG. 1 is a sectional view that is in correspondence with the photoelectric conversion elements 303, the transfer transistors 304, and the amplification transistors 306 shown in FIG. 12. The other portions are not described. FIG. 1 shows a structure for two pixels.

FIG. 1 shows a first chip 101, a second chip 102, and a bonding surface 103 of the first chip and the second chip. The first chip 101 corresponds to the first chip 308 shown in FIG. 12, and the second chip 102 corresponds to the second chip 309 shown in FIG. 12.

The first chip 101 has a first substrate 104. A surface of the first substrate 104 where a transistor is formed is a principal surface 105, and a surface thereof opposite thereto is a back surface 106. A portion constituting the photoelectric conversion element 303 and the transfer transistor 304 shown in FIG. 12 is disposed at the first substrate 104. A multilayer wiring structure 107, including a first wiring layer 122 and a second wiring layer 123, which, for example, have wires whose main component is aluminum (aluminum wires), is provided on an upper portion at a principal-surface-105-side of the first substrate 104 of the first chip 101. Here, a plurality of interlayer insulating films of the multilayer wiring structure 107 are described as an integral insulating film.

The second chip 102 has a second substrate 108. A surface of the second substrate 108 where a transistor is formed is a principal surface 109, and a surface thereof opposite thereto is a back surface 110. A multilayer wiring structure 111, including a first wiring layer 128 and a second wiring layer 129, which, for example, have aluminum wires, is provided on an upper portion of the principal surface 109 of the second substrate 108. Even here, a plurality of interlayer insulating films of the multilayer wiring structure 111 are described as an integral insulating film. An amplification transistor 306 shown in FIG. 12 is disposed at the second substrate 108. In the description, in each chip, a direction from the principal surface of the substrate to the back surface is defined as a downward direction or a deep direction, and a direction from the back surface to the principal surface is defined as an upward direction or a shallow direction.

Here, in the solid-state image pickup apparatus according to the embodiment, the substrate principal surface 105 of the first chip 101 and the substrate principal surface 109 of the second chip 102 are placed upon each other so as to face each other. In FIG. 1, in a structure of a connection portion of the first chip 101 and the second chip 102, a connection between a floating diffusion region (FD region) 113 of the first chip 101 and the gate electrode 126 of an amplification transistor 126 of the second chip 102 is only shown. More specifically, the FD region 113 of the first chip 101 is connected to the gate electrode 126 of the amplification transistor through the multilayer wiring structure 107, a connection portion 311, and the multilayer wiring structure 111. The connection portion 310 shown in FIG. 12 that supplies a control signal to the gate electrode 114 of the transfer transistor is not shown in FIG. 1. The solid-state image pickup apparatus according to the embodiment is a backside-illumination solid-state image pickup apparatus upon which light is incident from the back surface 106 of the first substrate 104.

Each chip will be described in detail. First, a well 115, an N-type charge storage region 112 constituting the photoelectric conversion element, and the gate electrode 114 of the transfer transistor are disposed at the first substrate 104 of the first chip 101. Further, a P-type surface protection layer constituting the photoelectric conversion element is disposed on the upper portion of the charge storage region 112. Further, a P-type semiconductor region 116, an element isolation region 117, and the drain region 113 of the transfer transistor are disposed at the first substrate 104. The well 115 is a semiconductor region where the transistor and the photoelectric conversion element are disposed, and, here, may be either a N type or a P type. The P-type semiconductor region 116 can suppress dark current generated at an interface between a silicon oxide film and silicon of the back surface 106 of the first substrate 104, and can even function as a portion of the photoelectric conversion element. The charge storage region 112 stores electric charge (electrons) generated at the photoelectric conversion element, and has a P-type surface protective layer at a gate-electrode-side of the transfer transistor in FIG. 1. The element isolation region 117 is formed of a P-type semiconductor region, and, although not shown, may have an element isolation structure including an insulating film such as a LOCOS isolation layer or a STI isolation layer. The drain region 113 of the transfer transistor is an FD region, and constitutes the node 305 shown in FIG. 12. A back-surface-106-side of the first substrate 104 of the first chip 101 is provided with an antireflection film 118, a light-shielding film 119, a color filter layer 120 including a planarizing layer, and a microlens 121.

Figure 12:
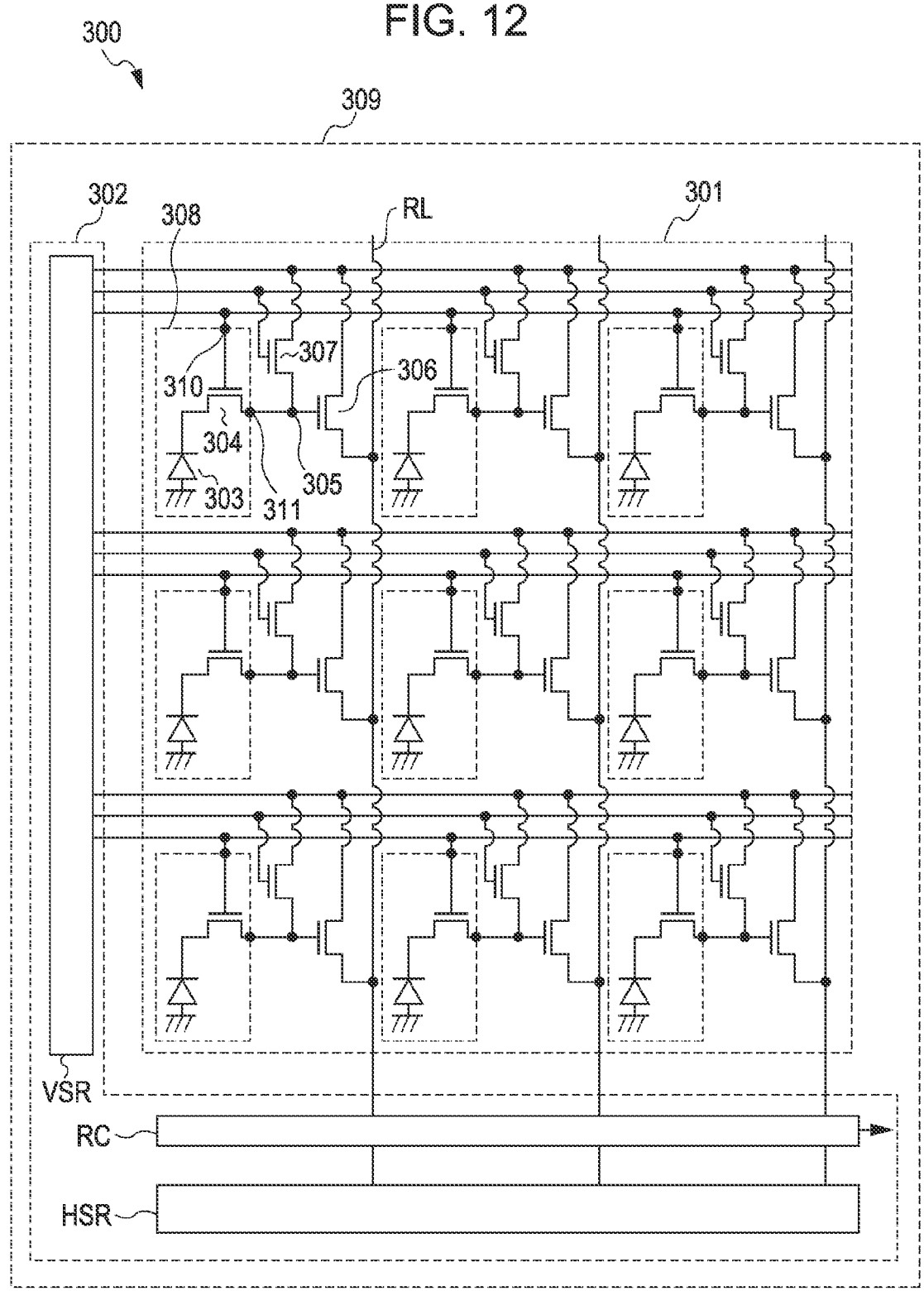
FIG. 12 is an exemplary circuit of the solid-state image pickup apparatus according to the present invention.

Next, a well 124, a source region and drain region 125, and the gate electrode 126 of the amplification transistor 306 in FIG. 12, and an element isolation region 127 are disposed at the second substrate 108 of the second chip 102. The well 124 is a P-type semiconductor region. Here, the source region and drain region 125 of the transistor (the amplification transistor 306 shown in FIG. 12), disposed at the second chip 102 of the solid-state image pickup apparatus according to the embodiment, include a high-melting-metal compound layer 130. A region constituting the peripheral circuit portion 302 shown in FIG. 12, disposed at the second chip 102, is also similarly provided with a transistor including a high-melting-metal compound layer (not shown). The high-melting-metal compound layer is, for example, silicide using cobalt or titanium, which is a high-melting metal, when silicon is used in the semiconductor substrate.

A high-melting-metal compound layer is not formed at, for example, the transistor of the first substrate 104. The insulating film of a multilayer wiring structure is disposed at the upper portion of the principal surface 105 of the first substrate 104. Accordingly, a high-melting-metal compound layer is not formed at the first substrate 104 and the transistor of the peripheral circuit portion disposed at the second substrate has a high-melting-metal compound layer, so that it is possible to increase the speed of operation of the transistor while reducing noise. In addition, by providing the transistor including such a high-melting-metal compound layer only at the second chip 102, it is possible to reduce mixing of the high-melting metal into the photoelectric conversion element, and to reduce noise generated by the mixture of the high-melting metal. Since it is not necessary to form a region where a high-melting-metal compound layer is to be provided and a region where a high-melting-metal compound layer is not to be provided on the same substrate, it is not necessary to form, for example, a protective film to prevent the formation of a high-melting-metal compound layer, that is, it is possible for each substrate to have a simple structure and to manufacture it using a simple step.

In the embodiment, in addition to the photoelectric conversion element, the FD region is formed at the first substrate 104. This is because, if a high-melting-metal compound layer is provided at the photoelectric conversion element and the semiconductor region constituting the FD region which hold signal charges, noise generated when a high-melting metal is mixed into the semiconductor region mixes in the signal electric charges. If the amplification transistor is disposed at the first substrate, a high-melting-metal compound layer is not formed at the amplification transistor.

Although, in the embodiment, each wiring layer is formed of aluminum wires, each wiring layer may be formed of wires whose main component is copper (copper wires). A diffusion prevention film, which prevents diffusion of copper, may also be provided at upper portions of the copper wires, and the diffusion prevention film, which prevents diffusion of copper, may be subjected to patterning.

Second Embodiment

A solid-state image pickup apparatus according to this embodiment will be described with reference to FIG. 2. The solid-state image pickup apparatus according to the embodiment is similar to the solid-state image pickup apparatus according to the first embodiment in that its circuits are equivalent to those shown in FIG. 12, and differs therefrom in its chip stacking structure. A description of the circuits will hereunder be omitted. The structure shown in FIG. 2 will hereunder be described.

Figure 2:
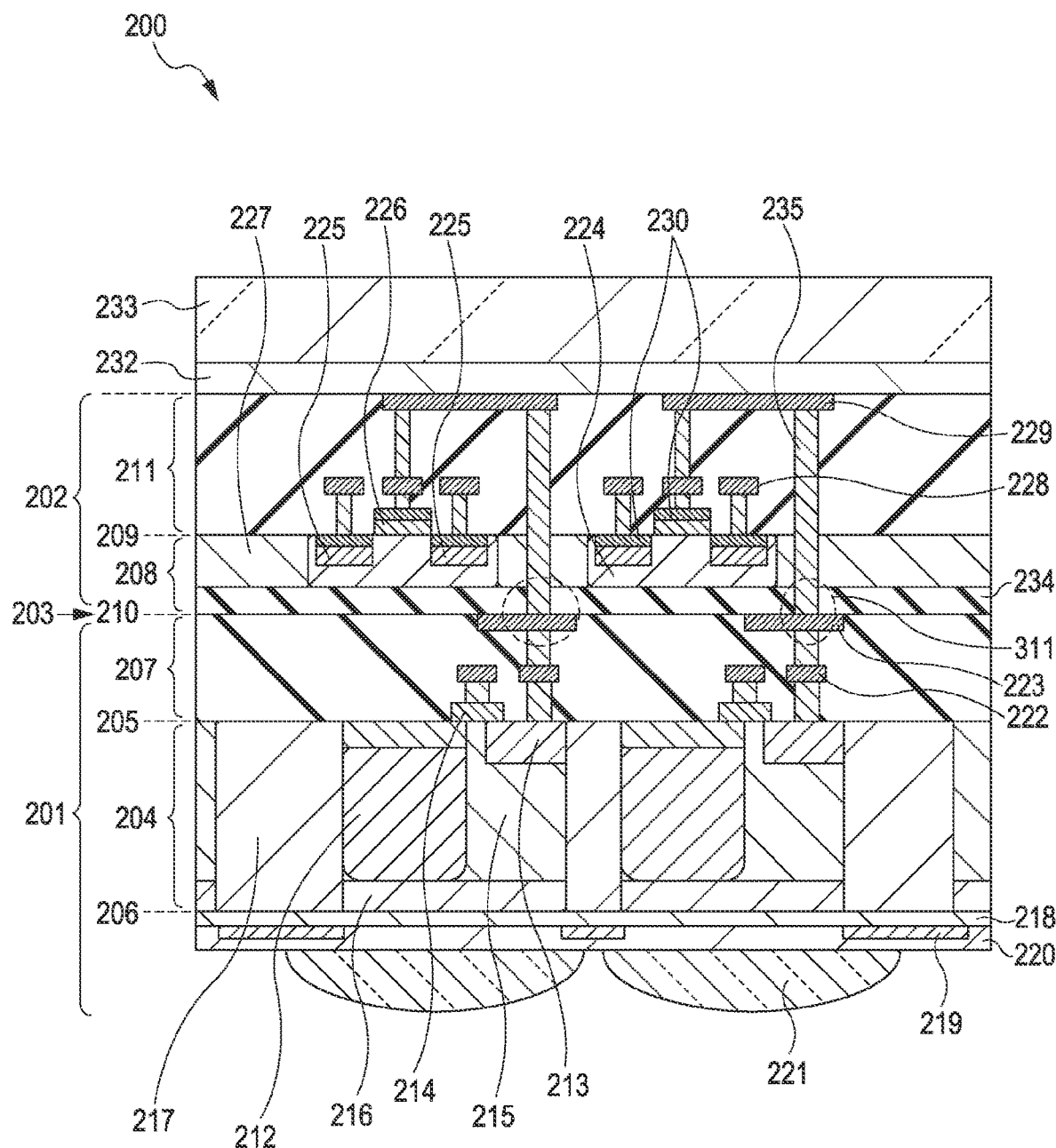
FIG. 2 is a sectional view of a solid-state image pickup apparatus used to describe a second embodiment.

FIG. 2 is a sectional view of a solid-state image pickup apparatus 200 corresponding to the circuits shown in FIG. 12. FIG. 2 is a sectional view for two pixels in correspondence with the photoelectric conversion elements 303, the transfer transistors 304, and the amplification transistors 306 shown in FIG. 12, and does not show the other portions.

FIG. 2 shows a first chip 201, a second chip 202, and a bonding surface 203 of the first chip and the second chip. The first chip 201 corresponds to the first chip 308 shown in FIG. 12, and the second chip 202 corresponds to the second chip 309 shown in FIG. 12.

The first chip 201 has a first substrate 204. A surface of the first substrate 204 where a transistor is formed is a principal surface 205, and a surface thereof opposite thereto is a back surface 206. A portion constituting the photoelectric conversion element 303 and the transfer transistor 304 shown in FIG. 12 is disposed at the first substrate 204. A multilayer wiring structure 207, including a first wiring layer 222 and a second wiring layer 223, which, for example, have aluminum wires, is provided on an upper portion at the principal surface 205 of the first substrate 204. Here, a plurality of interlayer insulating films of the multilayer wiring structure 207 are described as an integral insulating film.

The second chip 202 has a second substrate 208. A surface of the second substrate 208 where a transistor is formed is a principal surface 209, and a surface thereof opposite thereto is a back surface 210. A multilayer wiring structure 211, including a first wiring layer 228 and a second wiring layer 229, which, for example, have aluminum wires, is provided on an upper portion of the principal surface 209 of the second substrate 208. Even here, a plurality of interlayer insulating films of the multilayer wiring structure 211 are described as an integral insulating film. An amplification transistor 306 shown in FIG. 12 is disposed at the second substrate 208.

Here, in the solid-state image pickup apparatus according to the embodiment, the principal surface 205 of the first substrate 204 and the back surface 210 of the second substrate 208 are placed upon each other so as to face each other. In FIG. 2, in a structure of a connection portion of the first chip 201 and the second chip 202, a connection between an FD region 213 of the first chip 201 and a gate electrode 226 of an amplification transistor of the second chip 202 is only shown. More specifically, the FD region 213 of the first chip 201 is connected to the gate electrode 226 of the amplification transistor through the multilayer wiring structure 207, a connection portion 311, and the multilayer wiring structure 211. Here, a through electrode 235 constituting a portion of the connection portion 311 and penetrating the second substrate 208 is disposed. By the through electrode, the FD region 213 and the gate electrode 226 of the amplification transistor are connected to each other. The connection portion 310 shown in FIG. 12 that supplies a control signal to the gate electrode 214 of the transfer transistor is not shown in FIG. 2. The solid-state image pickup apparatus according to the embodiment is a backside-illumination solid-state image pickup apparatus upon which light is incident from the back surface 206 of the first substrate 204.

Next, each chip will be described in detail. A well 215, an N-type charge storage region 212, constituting the photoelectric conversion element, and the gate electrode 214 of the transfer transistor are disposed at the first substrate 204 of the first chip 201. Further, a P-type semiconductor region 216, an element isolation region 217, and the drain region 213 of the transfer transistor are disposed at the first substrate 204. A back-surface-206-side of the first substrate 204 of the first chip 201 is provided with an antireflection film 218, a light-shielding film 219, a color filter layer 220 including a planarizing layer, and a microlens 121. Next, a well 224, a source region and drain region 225, and the gate electrode 226 of the amplification transistor 306 in FIG. 12, and an element isolation region 227 are disposed at the second substrate 208 of the second chip 202. In addition, the first wiring layer 228 and the second wiring layer 229 are provided at the upper portion of the second substrate 208, and an insulating layer 234 is provided at a deepest portion of the second substrate 208. The structures of the first chip 201 and the second chip 202 are similar to those of the first embodiment, so that they will not be described below.

In the second embodiment, an adhesive layer 232 and a supporting base 233 are further provided at the upper portion of the second chip 202. The insulating layer, the adhesive layer 232, and the supporting base 233 in the second embodiment will be described later.

Here, the source region and drain region 225 and the gate electrode 226 of the transistor (the amplification transistor 306 shown in FIG. 12) disposed at the second chip 202 of the solid-state image pickup apparatus according to the embodiment have high-melting-metal compound layers 230. A region constituting the peripheral circuit portion 302 shown in FIG. 12, disposed at the second chip 202, is also similarly provided with a transistor including a high-melting-metal compound layer (not shown). The high-melting-metal compound layer is, for example, silicide using cobalt or titanium, which is a high-melting metal, when silicon is used in the semiconductor substrate. The transistor of, for example, the peripheral circuit portion disposed at the second substrate has a high-melting-metal compound layer, so that it is possible to increase the speed of operation of the transistor. In addition, by providing the transistor including such a high-melting-metal compound layer only at the second chip 202, it is possible to reduce mixing of the high-melting metal into the photoelectric conversion element, while suppressing a reduction in the characteristics of the photoelectric conversion element of the first chip 201. Since it is not necessary to form a region where a high-melting-metal compound layer is to be provided and a region where a high-melting-metal compound layer is not to be provided on the same substrate, it is not necessary to form, for example, a protective film to prevent the formation of a high-melting-metal compound layer, that is, it is possible for each substrate to have a simple structure and to manufacture it using a simple step.

Third Embodiment

A solid-state image pickup apparatus according to this embodiment will be described with reference to FIG. 3. The solid-state image pickup apparatus according to the embodiment corresponds to the solid-state image pickup apparatus 100 according to the first embodiment, and differs therefrom in that it includes a diffusion prevention film. The structure shown in FIG. 3 will hereunder be described. The structural features that are equivalent to those of the first embodiment will not be described.

Figure 3:
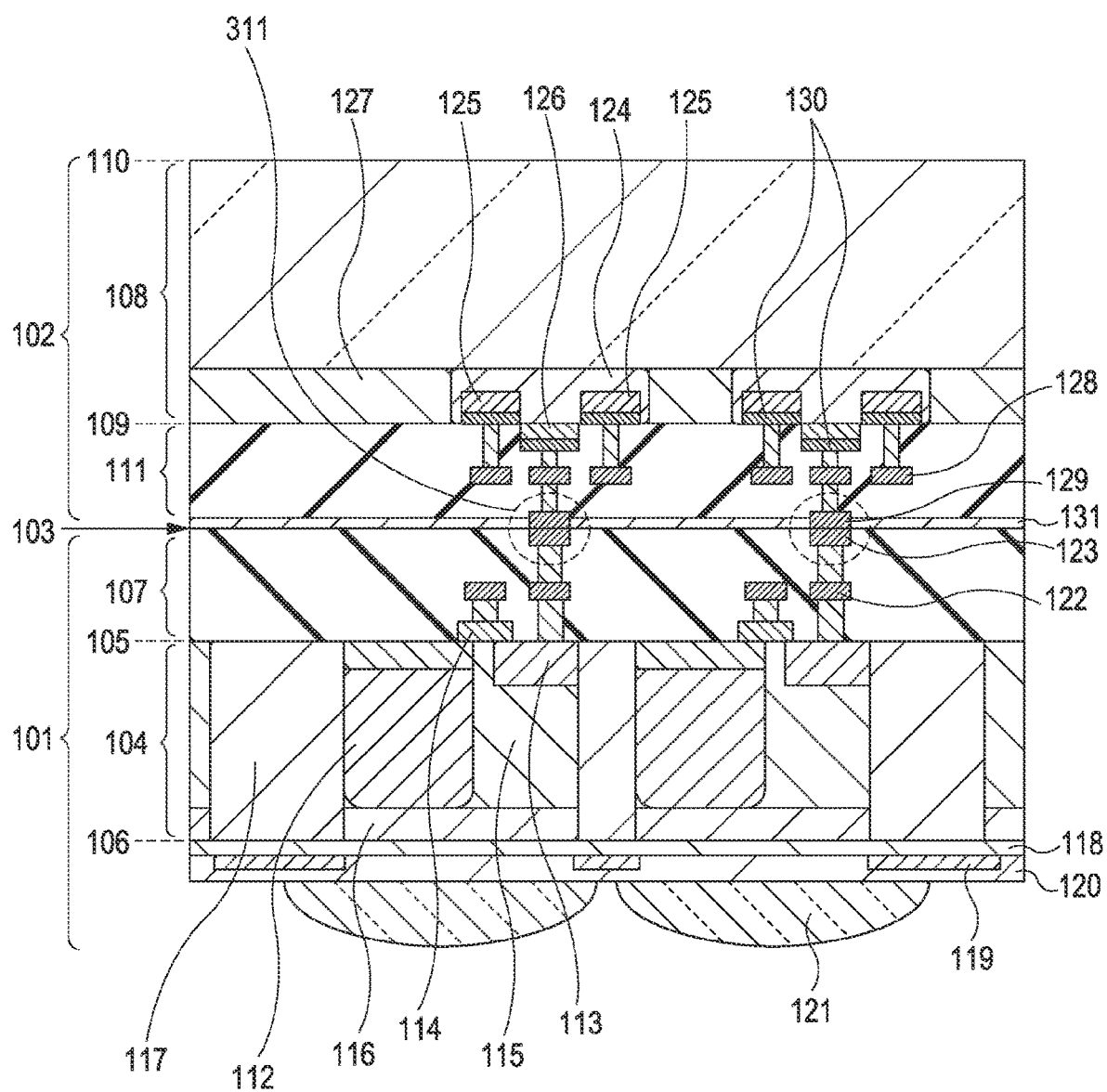
FIG. 3 is a sectional view of a solid-state image pickup apparatus used to describe a third embodiment.

In a solid-state image pickup apparatus 400 shown in FIG. 3, a diffusion prevention film 131 is disposed between a first chip 101 and a second chip 102. By providing such a diffusion prevention film 131, it is possible to suppress diffusion of a high-melting metal of a high-melting-metal compound layer disposed at the second chip into multilayer wiring structures 111 and 107 and mixture of the high-melting metal into a semiconductor region constituting an FD region and a photoelectric conversion element of the first chip. Therefore, it is possible to further suppress generation of leakage current causing a white defect (of an image) or a dark current to be produced when the high-melting metal is mixed into the semiconductor region.

A method of producing the solid-state image pickup apparatus 400 shown in FIG. 3 will be described with reference to FIGS. 4A and 4B and 5A and 5B. First, in FIG. 4A, a photo-diode formation member (hereunder referred to as "PD formation member") 401, which becomes a first substrate 104 shown in FIG. 3, and a circuit formation member 402, which becomes a second substrate 108 shown in FIG. 3, are provided. These members are, for example, silicon semiconductor substrates, and may be of any conductivity type. The PD formation member 401 includes a p-type semiconductor region 116 and an insulating layer 403. The PD formation member 401 uses an SOI substrate, and the p-type semiconductor region 116 may be formed by epitaxial growth or ion implantation.

Figure 4A:
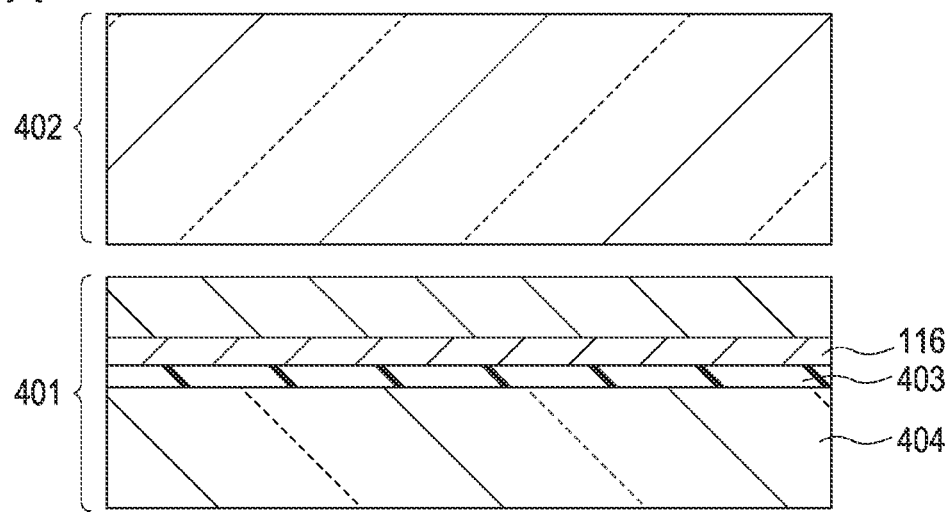
FIGS. 4A and 4B show a method of manufacturing the solid-state image pickup apparatus according to the third embodiment.
Figure 4B:
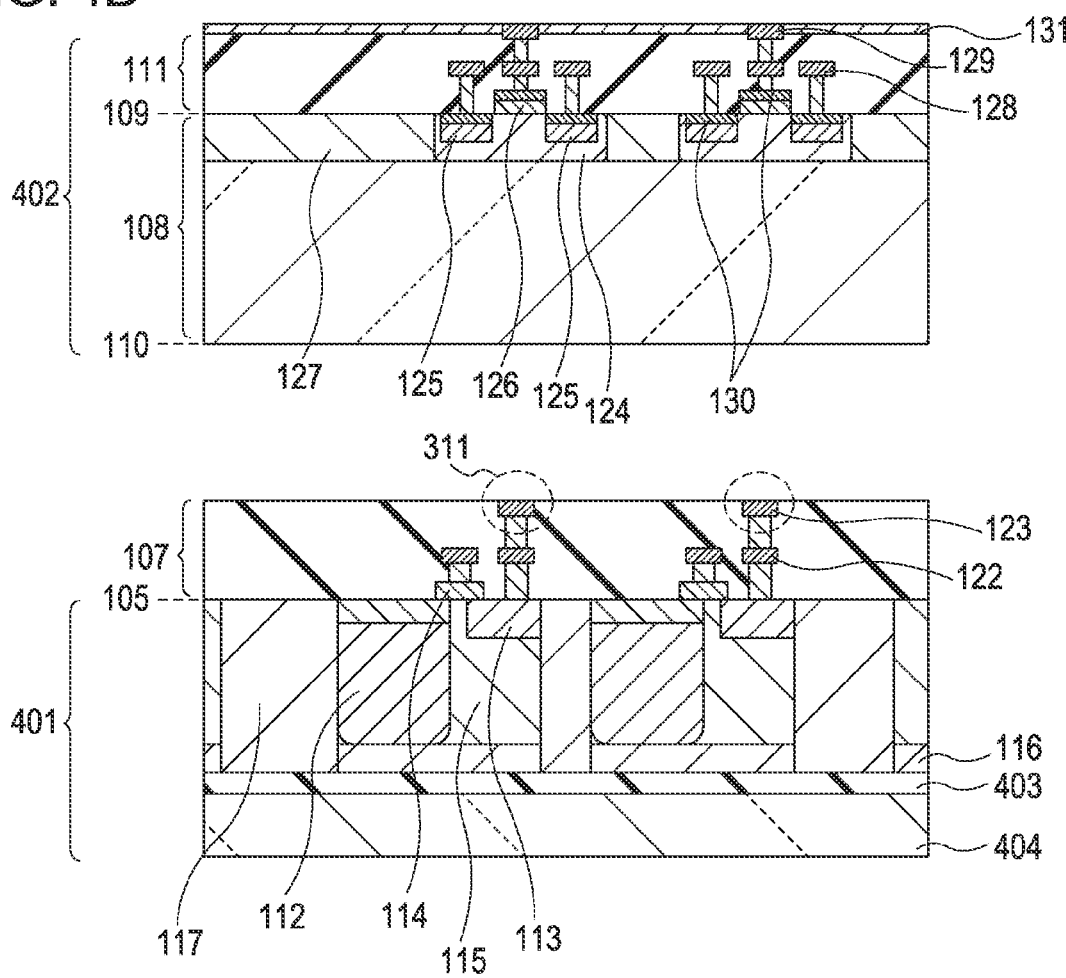

Next, as shown in FIG. 4B, elements such as a gate electrode 114 of a transfer transistor and a charge storage region 112 are formed at the PD formation member 401. The multilayer wiring structure 107 is formed on the upper portion of the PD formation member 401. The multilayer wiring structure 107 has a first wiring layer 122 and a second wiring layer 123. The first wiring layer 122 and the second wiring layer 123 include a plurality of wires. The wires in the embodiment are aluminum wires. The multilayer wiring structure 107 has an interlayer insulating film for insulating the wires from each other. For example, the interlayer insulating film is disposed between the first wiring layer 122 and the gate electrode of the transfer transistor, and between the first wiring layer 122 and the second wiring layer 123. For forming the multilayer wiring structure 107, a general semiconductor process may be used. Finally, an interlayer insulating film covering the second wiring layer is formed, and portions thereof are removed so that some wires of the second wiring layer 123 are exposed. The exposed second wiring layer 123 constitute a connection portion 311. A surface of the PD formation member 401 where the gate electrode of the transfer transistor is formed becomes a principal surface 105 of the first substrate described later.

In FIG. 4B, a well 124 and a peripheral circuit portion including a transistor such as an amplification transistor 306 are formed at the circuit formation member 402. Then, a high-melting metal is deposited on predetermined positions, such as a source region, a drain region 125, and a gate electrode 126 of the transistor, and heat treatment is performed, thereby forming a high-melting-metal compound layer 130. Thereafter, a multilayer wiring structure 111 is formed at the upper portion of the circuit formation member 402. The multilayer wiring structure 111 has a first wiring layer 128 and a second wiring layer 129. The structure and production method of the multilayer wiring structure 111 are similar to those of the multilayer wiring structure 107 of the PD formation member 401. Next, after forming the second wiring layer 129, a diffusion prevention film 131 covering the second wiring layer 129 is formed. The diffusion prevention film 131 is formed of, for example, silicon nitride or silicon carbide. The diffusion prevention film 131 is for suppressing diffusion to the high-melting metal PD formation member 401. Thereafter, portions of the diffusion prevention film 131 are removed so that some wires of the second wiring layer 129 constituting the connection portion 311 are exposed. Here, the diffusion prevention film may be removed by etching or CMP technology. Here, the circuit formation member 402 becomes the second substrate 108. A principal surface 109 of the second substrate 108 is determined as shown in FIG. 4B.

Figure 5A:
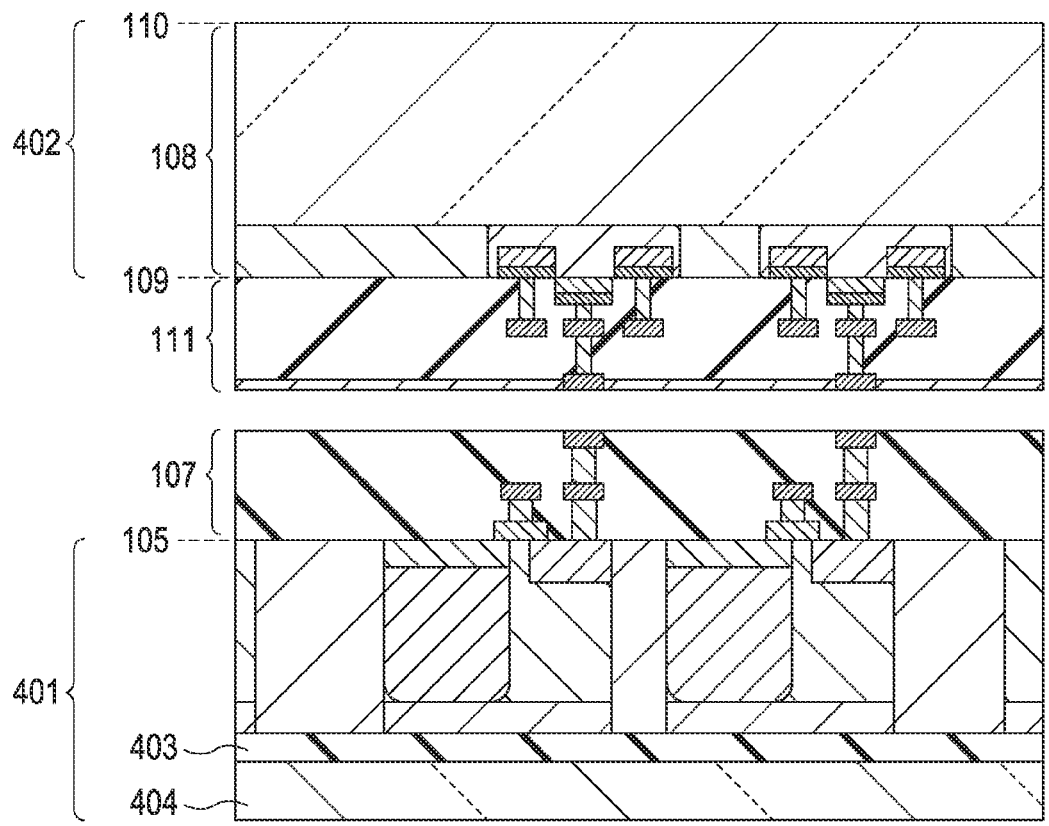
FIGS. 5A and 5B show the method of manufacturing the solid-state image pickup apparatus according to the third embodiment.

Next, as shown in FIG. 5A, the principal surfaces (105, 109) of the PD formation member 401 and the circuit formation member 402 are disposed so as to face each other, and are joined to each other by, for example, a micro-bump.

Figure 5B:
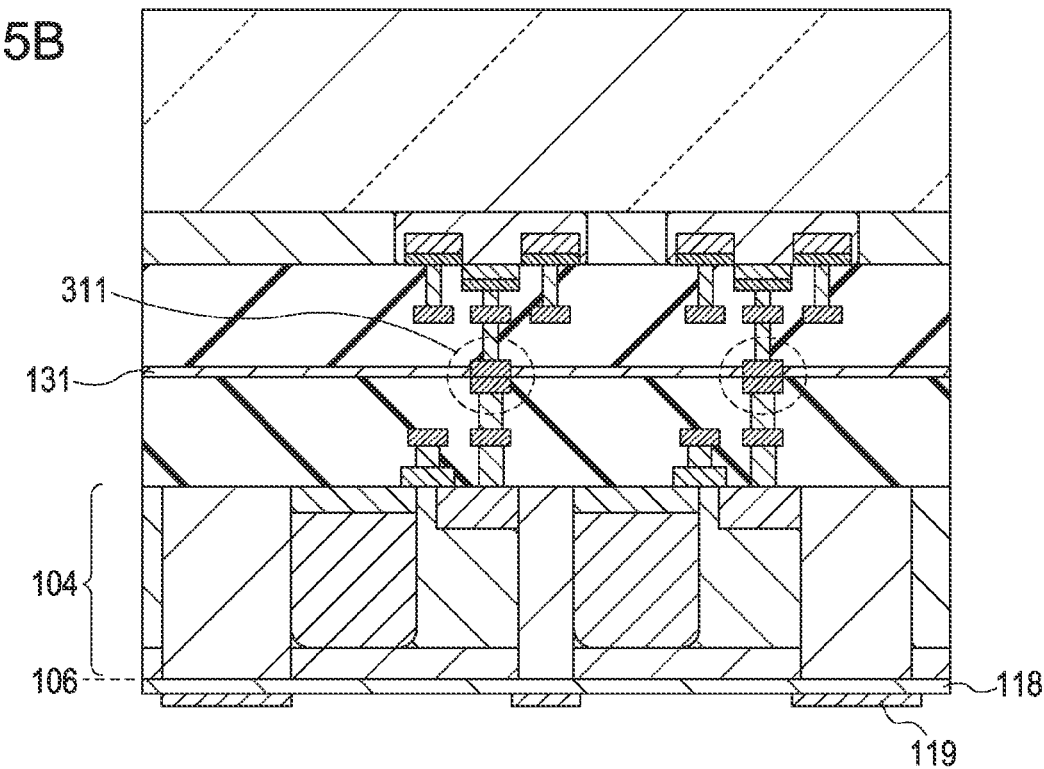

Finally, as shown in FIG. 5B, an undesired portion 404 and the insulating layer 403 of the PD formation member 401 are removed by, for example, CMP or etching, so that the PD formation member 401 is made thinner, to form the first substrate 104. Thereafter, an antireflection film 118, formed of silicon carbide, is formed at the upper portion of a back surface 106 of the first substrate 104. After forming the antireflection film 118, a tungsten film is formed at the upper portion of the antireflection film 118 for patterning, thereby forming a light-shielding film 119. Thereafter, a planarizing layer and a color filter 120 are formed, and a microlens 121 is formed. Such a production method makes it possible to produce the solid-state image pickup apparatus 400 shown in FIG. 3.

Here, according to the structure of the embodiment, after forming the interlayer insulating film of the multilayer wiring structure 107, it is possible to perform heat treatment at a high-temperature or for a long time for improving characteristics such as recovery from defects of the photoelectric conversion element. If the first substrate is provided with a high-melting-metal compound layer, a high-melting metal semiconductor compound layer is formed before forming the interlayer insulating film. After forming the interlayer insulating film, it becomes difficult to perform heat treatment at a high temperature or for a long time due to problems such as diffusion of the high-melting metal. Therefore, according to the structure of the embodiment, since heat treatment for recovering from defects of the photoelectric conversion element may be optionally performed, it is possible to suppress a reduction in the characteristics of the photoelectric conversion element.

In a desirable form, for increasing connection resistance of a contact provided at an FD region, it is desirable to perform ion implantation and heat treatment on the semiconductor region that is connected to a plug. However, as mentioned above, if the first substrate is provided with a high-melting-metal compound layer, it becomes difficult to perform heat treatment in a contact formation step that is carried out after forming the interlayer insulating film. Therefore, according to the structure of the embodiment, it is possible to perform sufficient heat treatment in the step of forming the contact at the FD region where the high-melting-metal compound layer is not provided while the high-melting-metal compound layer is provided at the peripheral circuit portion. Therefore, it is possible to properly connect the contact at the FD region while reducing contamination of the high-melting metal at the FD region.

As discussed above, according to the solid-state image pickup apparatus of the embodiment, it is possible to further suppress generation of dark current at the photoelectric conversion element while increasing the speed of operation of the transistor at the peripheral circuit portion and increasing the speed of a signal readout operation.

Fourth Embodiment

A solid-state image pickup apparatus according to this embodiment will be described with reference to FIG. 6. The structure of the solid-state image pickup apparatus according to this embodiment corresponds to the structure of the solid-state image pickup apparatus according to the second embodiment, and differs therefrom in that it includes a diffusion prevention film. The structure shown in FIG. 6 will hereunder be described. The structural features that are equivalent to those of the second embodiment will not be described.

Figure 6:
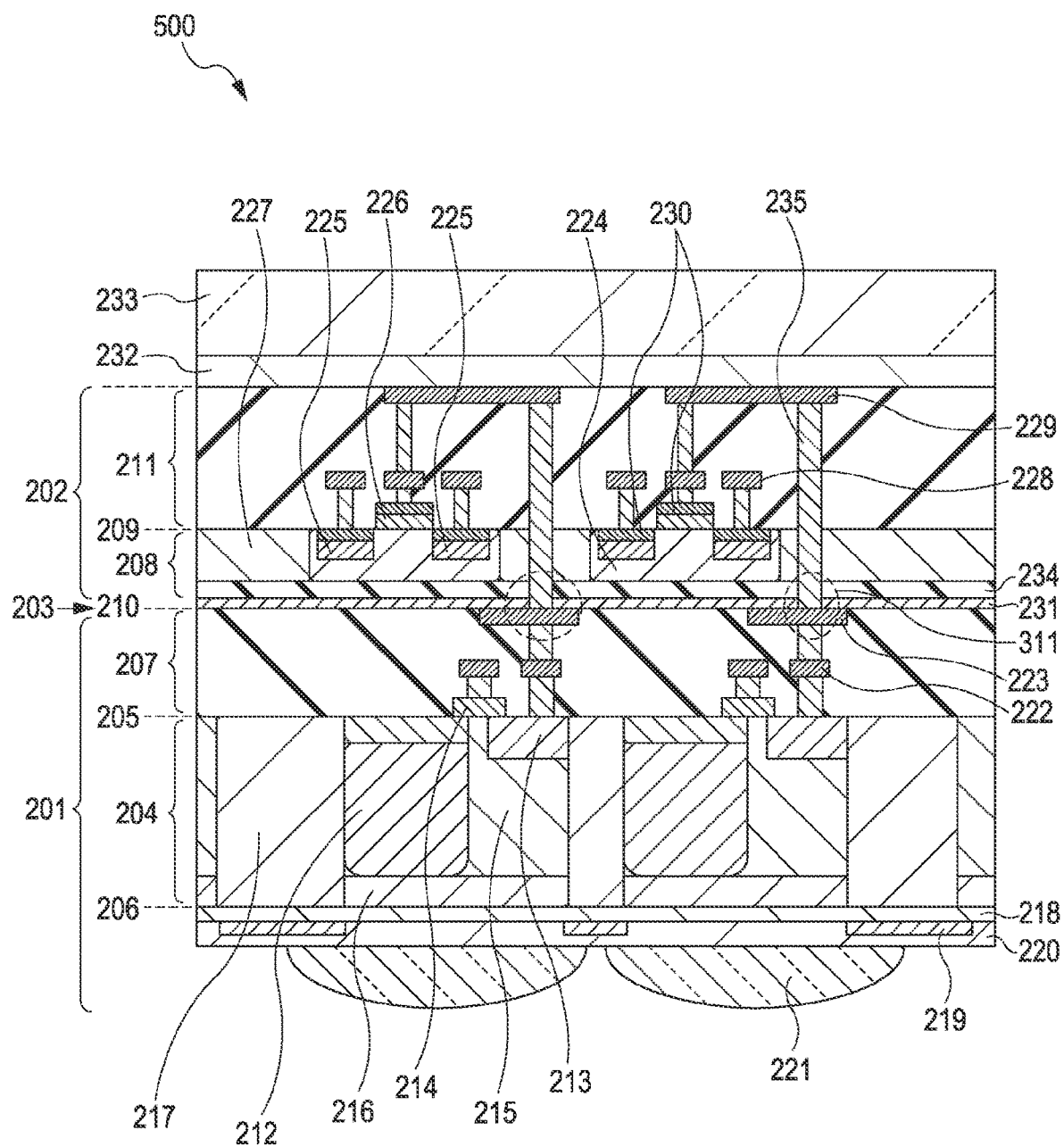
FIG. 6 is a sectional view of a solid-state image pickup apparatus used to describe a fifth embodiment.

In a solid-state image pickup apparatus 500 shown in FIG. 6, a diffusion prevention film 231, which prevents diffusion of a high-melting metal, is disposed between a first chip 201 and a second chip 202. By providing such a diffusion prevention film 231, it is possible to further suppress mixing of a high-melting metal of a high-melting-metal compound layer disposed at the second chip into a semiconductor region constituting an FD region and a photoelectric conversion element of the first chip. Therefore, it is possible to suppress production of a white defect (of an image) or a dark current. The diffusion prevention film 231 is a film formed of, for example, silicon nitride or silicon carbide.

Next, a method of producing the solid-state image pickup apparatus 500 shown in FIG. 6 will be described with reference to FIGS. 7A to 9. First, in FIG. 7A, a photo-diode formation substrate (hereunder referred to as "PD formation member") 501, which becomes a first substrate 204 shown in FIG. 6, and a circuit formation member 502, which becomes a second substrate 208 shown in FIG. 6, are provided. The PD formation member 501 includes a p-type semiconductor region 216 and an insulating layer 503. The PD formation member 501 uses an SOI substrate, and the p-type semiconductor region 216 may be formed by epitaxial growth or ion implantation. The circuit formation member 502 uses an SOI substrate and includes an insulating layer 234.

Figure 7A:
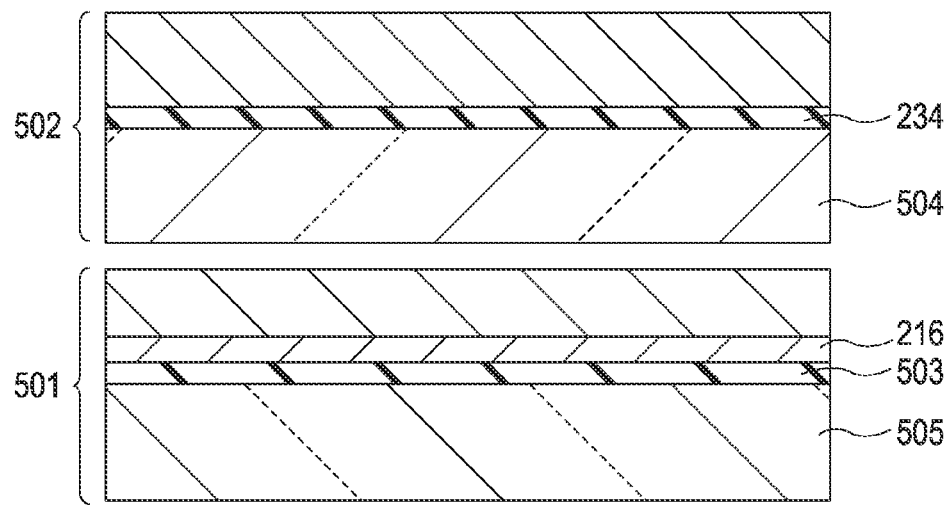
FIGS. 7A and 7B show a method of manufacturing a solid-state image pickup apparatus according to a fourth embodiment.
Figure 7B:
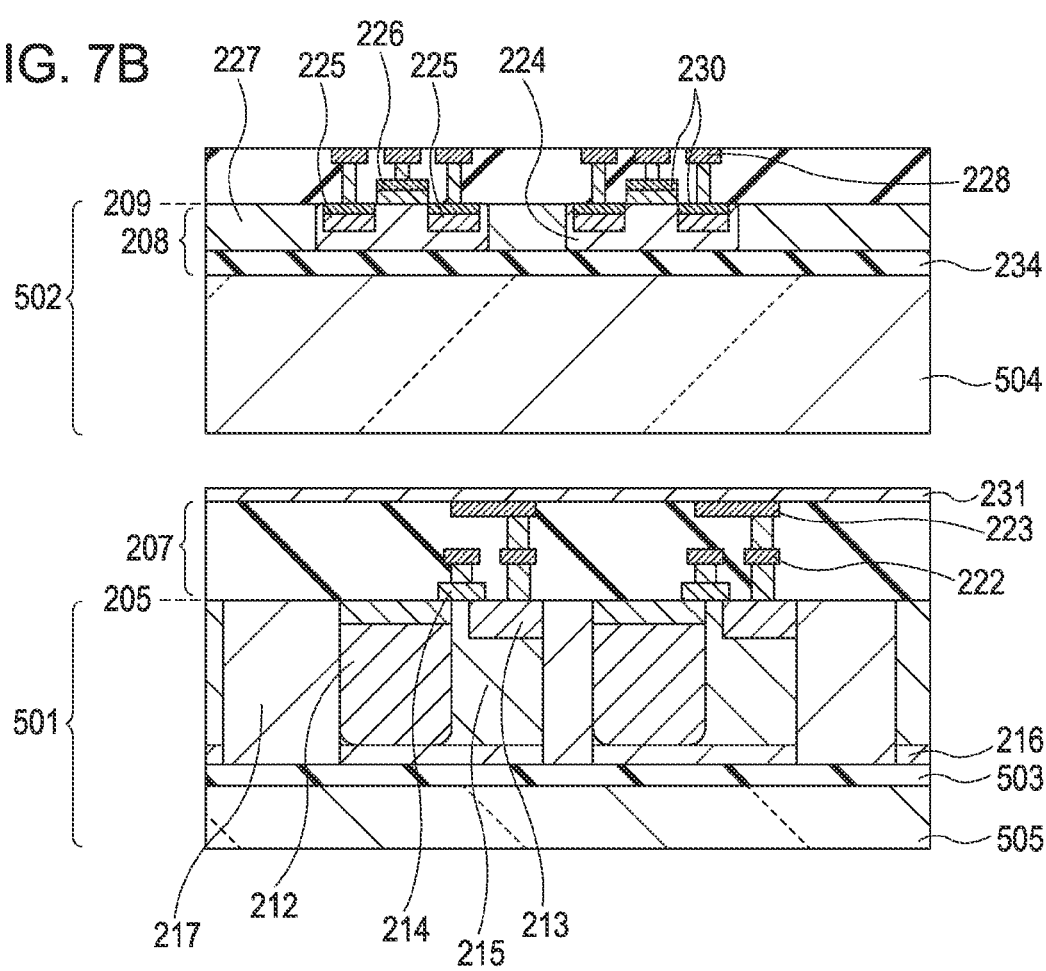

Next, in the PD formation member 501 shown in FIG. 7B, elements such as a gate electrode 214 of a transfer transistor, a charge storage region 212, and a well 215 are formed. A multilayer wiring structure 207 is formed on the upper portion of the PD formation member 501. The multilayer wiring structure 207 includes a first wiring layer 222 and a second wiring layer 223. The structure and production method of the multilayer wiring structure 207 are similar to those of the third embodiment, so that they will not be described. Next, an interlayer insulating film covering the second wiring layer 223 is formed, and portions of the interlayer insulating film are removed so that wires of the second wiring layer 223 are exposed. The second wiring layer 223 constitutes a connection portion 311. Then, a diffusion prevention film 231 covering the second wiring layer 223 and formed of, for example, silicon nitride or silicon carbide is formed. The interlayer insulating film covering the second wiring layer 233 may be disposed between the second wiring layer 223 and the diffusion prevention film 231.

In the circuit formation member 502 shown in FIG. 7B, a transistor including an amplification transistor and a well 224 are formed. Then, a high-melting metal is deposited on predetermined positions, such as a source region, a drain region, and a gate electrode of the transistor, and heat treatment is performed, thereby forming a high-meltingmetal compound layer 230. Thereafter, a multilayer wiring structure 211 is formed on the upper portion of the circuit formation member 502. The multilayer wiring structure 211 has a first wiring layer 228. The structure and production method of the first wiring layer 228 are similar to those of the third embodiment.

Figure 8A:
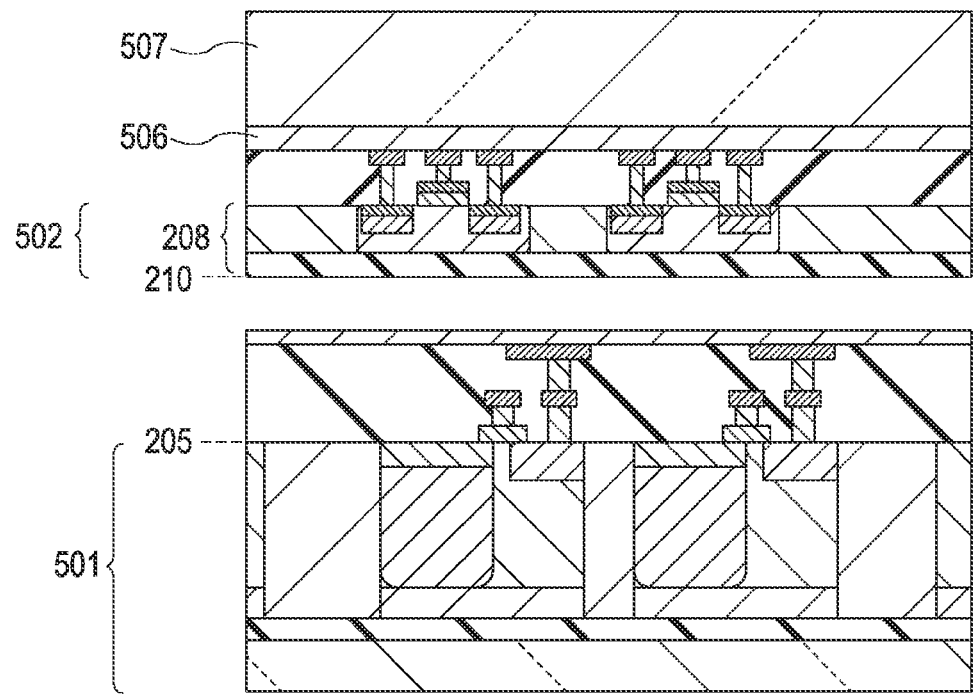
FIGS. 8A and 8B show the method of manufacturing the solid-state image pickup apparatus according to the fourth embodiment.

Next, in FIG. 8A, an adhesive layer 506 and a supporting base 507 are formed at the upper portion of the first wiring layer 228 at the circuit formation member 502. Then, an undesired portion 504 of the circuit formation member 502 is removed by abrasion or etching, and the second substrate 208 is formed.

Figure 8B:
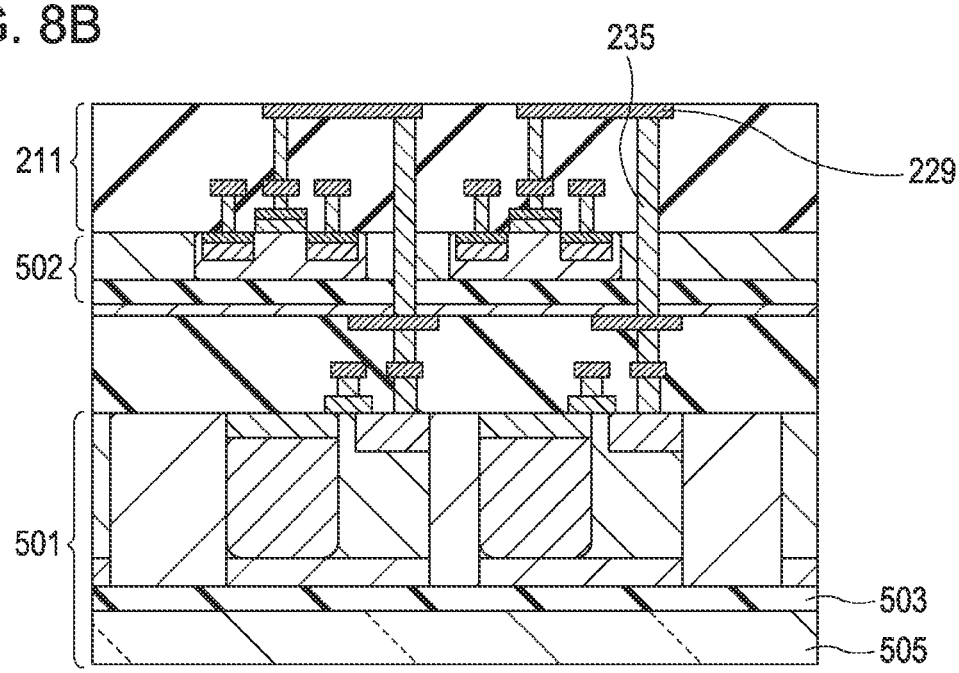

In FIG. 8B, a principal surface 205 of the PD formation member 501, which becomes the first substrate 204 shown in FIG. 6, and a back surface 210 of the second substrate 208 are placed upon each other so as to face each other, and are joined together by, for example, a micro-bump. Then, the first adhesive layer 506 and the first supporting base 507 are removed. Thereafter, an interlayer insulating film is formed on the upper portion of the first wiring layer 228 at the second substrate 208, and a through electrode 235 for electrical connection with the first substrate 204 is formed. The through electrode 235 may be produced by a general semiconductor process. Then, the through electrode 235 is covered, and the second wiring layer 229 is formed.

Figure 9:
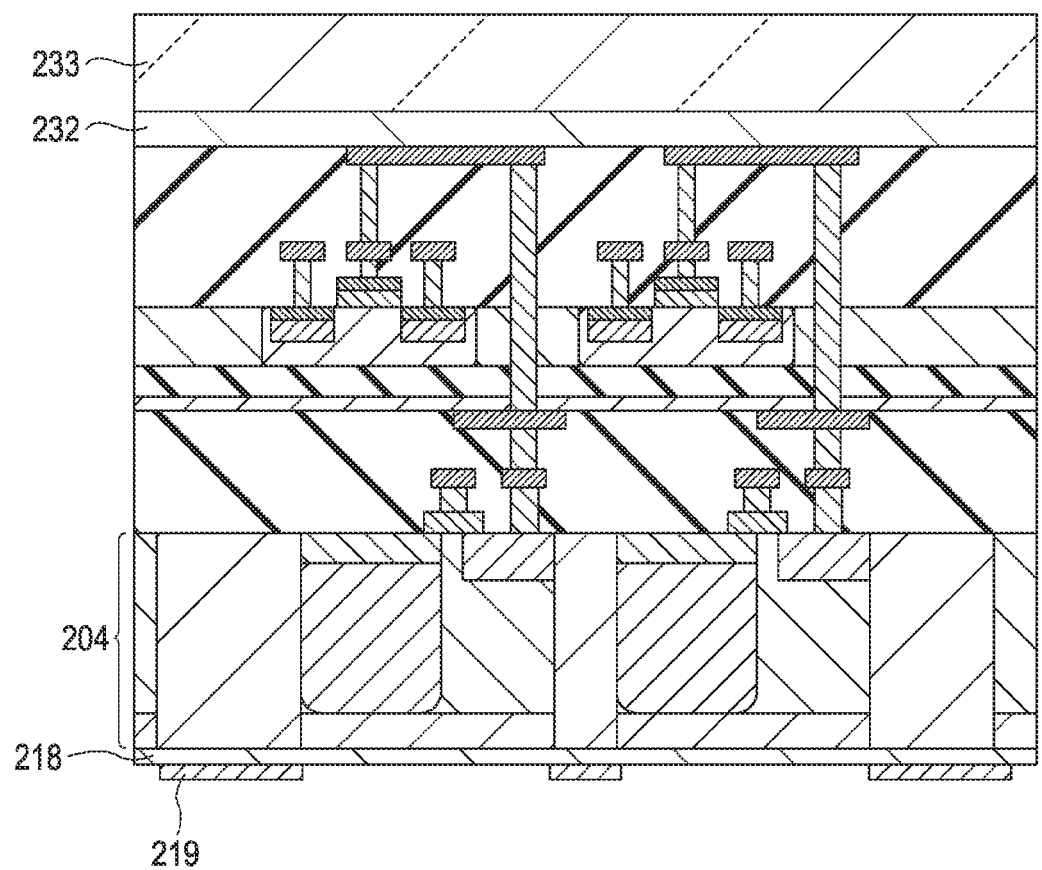
FIG. 9 shows the method of manufacturing the solid-state image pickup apparatus according to the fourth embodiment.

Next, as shown in FIG. 9, an adhesive layer 232 and a supporting base 233 are provided on the upper portion of the second wiring layer 229 at the second substrate 208. Then, an undesired portion 505 at the PD formation member 501 is removed by, for example, CMP or etching, and the first substrate 204 is formed. Thereafter, an antireflection film 218, formed of, for example, silicon nitride, is formed at the upper portion of a back surface 206 of the first substrate 204.

Then, a light-shielding film 219, formed of, for example, tungsten, is formed at the upper portion of the antireflection film 218. Further, a planarizing layer and a color filter 120 are formed at the upper portion of the light-shielding film 219, and a microlens 121 is formed. Such a production method makes it possible to produce the solid-state image pickup apparatus 500 shown in FIG. 6.

Even in the structure according to the embodiment, since heat treatment of a contact or a photoelectric conversion element can be optionally performed, it is possible to suppress a reduction in the characteristics of the photoelectric conversion element and an increase in the connection resistance of the contact.

As discussed above, according to the solid-state image pickup apparatus of the embodiment, it is possible to further suppress generation of dark current at the photoelectric conversion element while increasing the speed of operation of the transistor at the peripheral circuit portion and increasing the speed of a signal readout operation.

Fifth Embodiment

A solid-state image pickup apparatus according to this embodiment will be described with reference to FIGS. 10A to 10C. The structures of solid-state image pickup apparatuses 600, 610, and 620 according to the embodiment shown in FIGS. 10A to 10C correspond to the structure of the solid-state image pickup apparatus 400 according to the third embodiment, with the disposition of the diffusion prevention film 131 being modified. The structural features that are equivalent to those of the third embodiment will not be described below.

Figure 10A:
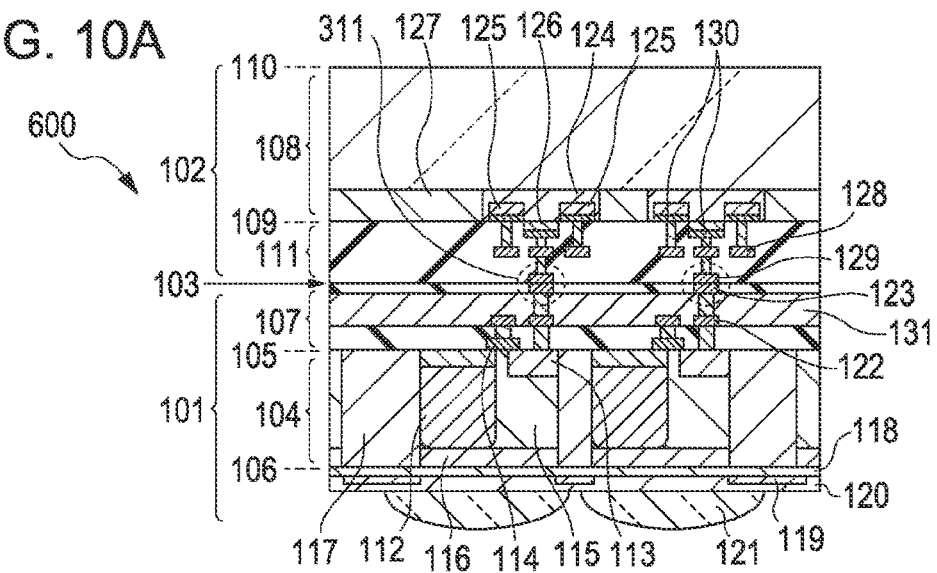
FIGS. 10A to 10C are sectional views of solid-state image pickup apparatuses used to describe the fifth embodiment.

In the solid-state image pickup apparatus 600 shown in FIG. 10A, the diffusion prevention film 131 is disposed between a first substrate 104 and a second substrate 108, and serves as an interlayer insulating film included in a multilayer wiring structure 107 disposed at the upper portion of the first substrate 104. By virtue of such a structure, it is possible to omit the step of forming an interlayer insulating film, and to make the solid-state image pickup apparatus thin. In addition, since the solid-state image pickup apparatus 600 is a backside-illumination solid-state image pickup apparatus, even if the diffusion prevention film 131, formed of, for example, silicon nitride, is provided on the entire top surface of a photoelectric conversion element, for example, reflection resulting from the difference between the refractive indices of the diffusion prevention film 131 and a silicon oxide film, which is a general interlayer insulating film, does not occur. Therefore, it is possible to suppress diffusion of a high-melting metal from the second substrate 108 while suppressing a reduction in the optical characteristics. The structure in which the diffusion prevention film 131 serves as an interlayer insulating film is not limited to the structure shown in FIG. 10A. For example, an interlayer insulating film in a multilayer wiring structure 111 disposed at the upper portion of the second substrate 108 may be used.

Figure 10B:
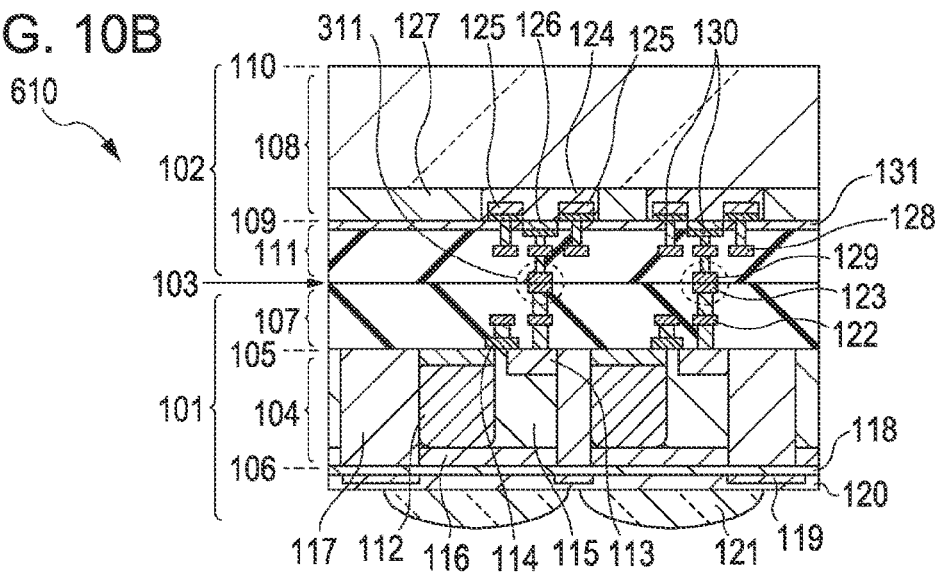

Next, in the solid-state image pickup apparatus 610 shown in FIG. 10B, the diffusion prevention film 131 is disposed between a first substrate 104 and a second substrate 108. In addition, the diffusion prevention film 131 is formed so as to contact a high-melting-metal compound layer 130 on a source region and drain region 125 and a gate electrode 126 at the second substrate 108. By virtue of such a structure, it is possible to use the diffusion prevention film 131 as an etching stop layer when forming a contact hole of the second substrate 108.

Figure 10C:
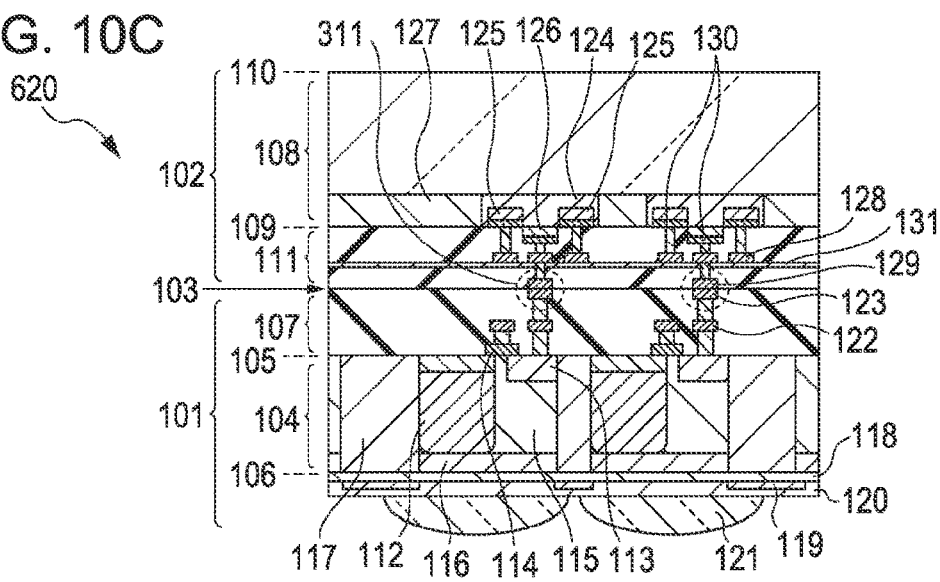

Next, in the solid-state image pickup apparatus 620 shown in FIG. 10C, the diffusion prevention film 131 is disposed between a first substrate 104 and a second substrate 108, and contacts the upper portion of a first wiring layer 228 at the second substrate 108. The first wiring layer 228 is formed of copper wires. The diffusion prevention film 131 also functions as a diffusion prevention film, which prevents diffusion of copper. By virtue of such a structure, it is possible to omit the step of forming the diffusion prevention film, which prevents diffusion of copper, and to make the solid-state image pickup apparatus thin. The structure in which the diffusion prevention film 131 serves as a diffusion prevention film, which prevents diffusion of copper, is not limited to the structure shown in FIG. 10C. For example, a multilayer wiring structure 107 disposed on the upper portion of the first substrate 104 may be formed of copper wires, and the diffusion prevention film 131 may be formed for each wiring layer.

Sixth Embodiment

A solid-state image pickup apparatus according to this embodiment will be described with reference to FIGS. 11A to 11C. The structures of solid-state image pickup apparatuses 700, 710, and 720 according to the embodiment shown in FIGS. 11A to 11C correspond to the structure of the solid-state image pickup apparatus 500 according to the fourth embodiment, with the disposition of the diffusion prevention film 231 being modified. The structural features that are equivalent to those of the fourth embodiment will not be described below.

Figure 11A:
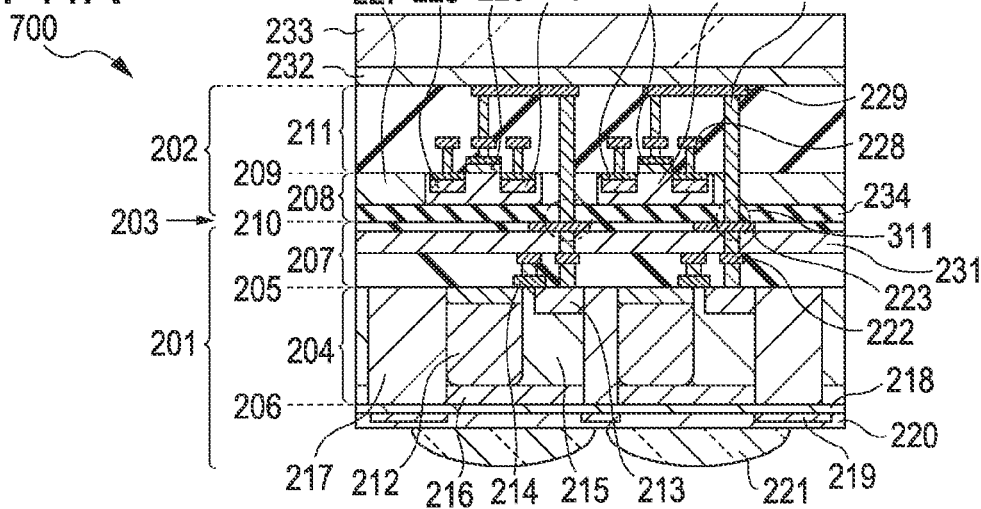
FIGS. 11A to 11C are sectional views of solid-state image pickup apparatuses used to describe a sixth embodiment.

In the solid-state image pickup apparatus 700 shown in FIG. 11A, the diffusion prevention film 231 is disposed between a first substrate 204 and a second substrate 208, and serves as an interlayer insulating film included in a multilayer wiring structure 207 disposed at the upper portion of the first substrate 104. By virtue of such a structure, it is possible to omit the step of forming an interlayer insulating film, and to make the solid-state image pickup apparatus thin. In addition, the solid-state image pickup apparatus 700 is a backside-illumination solid-state image pickup apparatus. Therefore, even if the diffusion prevention film 231, formed of, for example, silicon nitride, is provided on the entire top surface of a photoelectric conversion element, it is not necessary to consider reflection of incident light resulting from the difference between the refractive indices of the diffusion prevention film 231 and a silicon oxide film, which is a general interlayer insulating film. Therefore, it is possible to suppress diffusion of a high-melting metal from the second substrate 208.

Figure 11B:
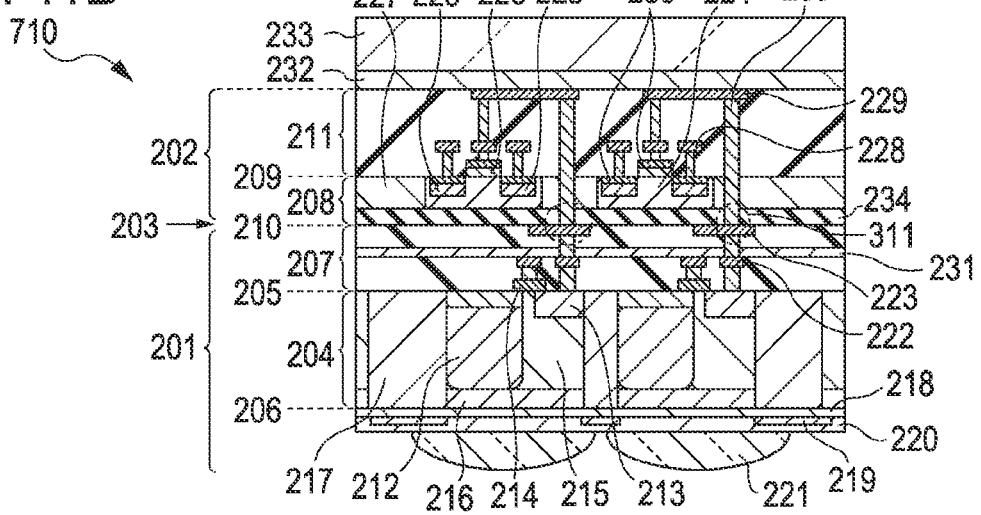
Figure 11C:
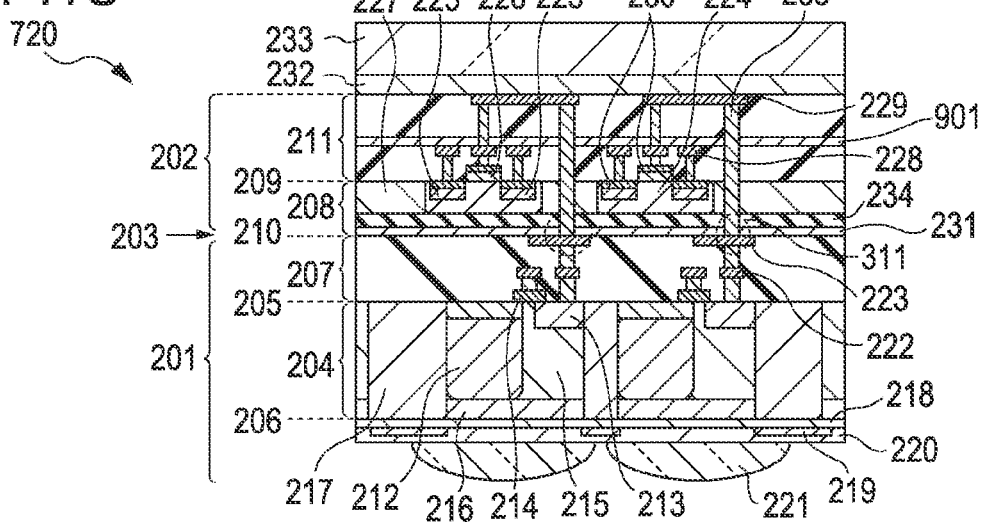

In the solid-state image pickup apparatus 710 shown in FIG. 11B, the diffusion prevention film 231 is disposed between a first substrate 204 and a second substrate 208, and contacts the upper portion of a first wiring layer 222 at the first substrate 208. The first wiring layer 222 is formed of copper wires. The diffusion prevention film 231 also functions as a diffusion prevention film, which prevents diffusion of copper. By virtue of such a structure, it is possible to omit the step of forming the diffusion prevention film, which prevents diffusion of copper, and to make the solid-state image pickup apparatus thin. The structure in which the diffusion prevention film 231 serves as a diffusion prevention film, which prevents diffusion of copper, is not limited to the structure shown in FIG. 11B. For example, as shown in FIG. 11C, of portions of a multilayer wiring structure 207 disposed at the upper portion of the first substrate 204, the second wiring layer 223 may be formed of copper wires, and the diffusion prevention film 231 may be disposed on the upper portion of the second wiring layer 223. Here, the diffusion prevention film 231 may be disposed at the upper portion of the first wiring layer 222. In order to reduce the capacity between the wiring layers, it is possible to perform patterning of a diffusion prevention film, which prevents diffusion of copper, in accordance with the forms of the wires at the upper portion of the first wiring layer 222, and remove a portion thereof. As shown in FIG. 11C, a multilayer wiring structure 211, disposed on the upper portion of a second substrate 208, may be formed of copper wires, and may include a copper diffusion prevention film 901.

Seventh Embodiment

In the embodiment, a case in which a photoelectric conversion apparatus according to the present invention is applied as an image pickup apparatus to an image pickup system is described in detail. The image pickup system may be, for example, a digital still camera or a digital camcorder. A block diagram of a case in which a photoelectric conversion apparatus is applied to a digital still camera, which is an example of the image pickup system, is shown in FIG. 13.

Figure 13:
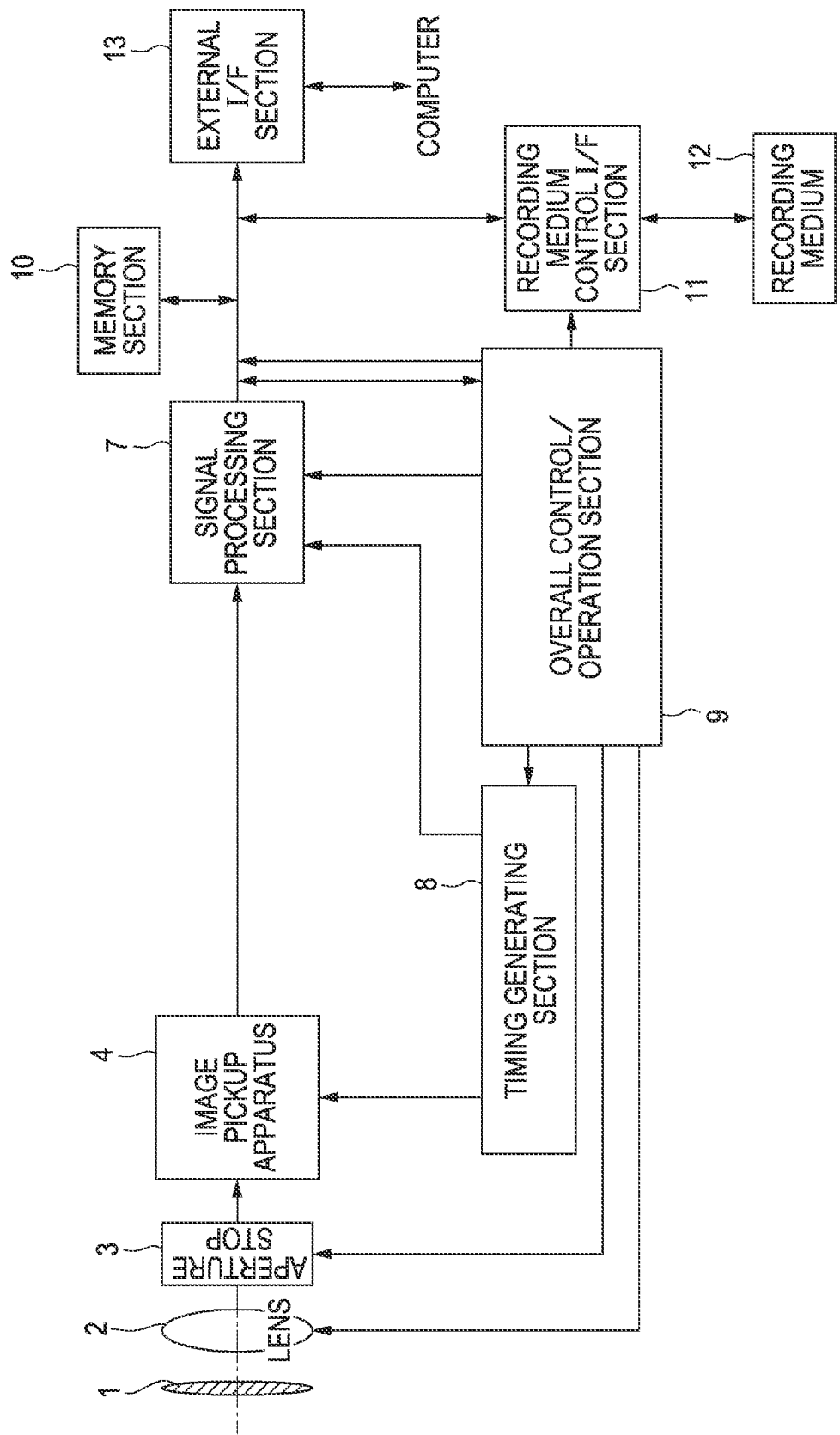
FIG. 13 is a block diagram illustrating an image pickup system according to a seventh embodiment.

In FIG. 13, reference numeral 1 denotes a barrier for protecting a lens, reference numeral 2 denotes a lens where an optical image of an object is formed at an image pickup apparatus 4, and reference numeral 3 denotes an aperture stop for varying the quantity of light transmitted through the lens 2. Reference numeral 4 denotes the image pickup apparatus, which is the solid-state image pickup apparatus described in any of the aforementioned embodiments. The image pickup apparatus 4 converts the optical image formed by the lens 2 as image data. Here, an AD converter is disposed at the image pickup apparatus 4. More specifically, the AD converter is formed at the second chip. Reference numeral 7 denotes a signal processing section that performs various corrections and data compression on image pickup data output from the image pickup apparatus 4. In addition, in FIG. 13, reference numeral 8 denotes a timing generating section that outputs various timing signals to the image pickup apparatus 4 and the signal processing section 7, and reference numeral 9 denotes an overall control/operation section that performs various operations and that controls the entire digital still camera. Reference numeral 10 denotes a memory section that temporarily stores the image data, reference numeral 11 denotes an interface section for performing a recording operation or a readout operation on a recording medium, and reference numeral 12 denotes the recording medium that is removable, such as a semiconductor memory for recording or reading out the image pickup data. In addition, reference numeral 13 denotes an interface section for performing communication with, for example, an external computer. Here, for example, a timing signal may be input from outside the image pickup system, and the image pickup system may include at least the image pickup apparatus 4 and the signal processing section 7 that processes an image pickup signal output from the image pickup apparatus. Although, in the embodiment, the case in which the AD converter is provided at the image pickup apparatus 4 is used, the image pickup apparatus and the AD converter may be provided at different chips. In addition, the signal processing section 7, etc. may be provided at the image pickup apparatus 4. Since a high-melting-metal compound layer is formed at the second chip of the image pickup apparatus 4, signal processing, etc. can be performed at a high speed. Accordingly, the photoelectric conversion apparatus according to the present invention is applicable to an image pickup system. By applying the photoelectric conversion apparatus according to the present invention to an image pickup apparatus, high-speed shooting can be performed.

As mentioned above, the solid-state image pickup apparatus according to the present invention makes it possible to provide a solid-state image pickup apparatus that can perform high-speed operations. Further, the diffusion prevention film makes it possible to reduce dark current, and to suppress the production of a white defect in an image. The embodiments are not limited to the described structures, and the embodiments may be combined as required. For example, the solid-state image pickup apparatus may include a plurality of diffusion prevention films, which prevents diffusion of a high-melting metal.

The high-melting-metal compound layer may be formed at a portion where an electrical potential is applied to a semiconductor region, such as a well contact, in addition to the source region, the drain region, and the gate electrode of a transistor.

According to the present invention, it is possible to provided, by using a simple structure, a solid-state image pickup apparatus in which a high-melting-metal compound layer is disposed at a peripheral circuit portion while a reduction in the characteristics of a photoelectric conversion element is suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

The present invention is applicable to a solid-state image pickup apparatus used in an image pickup system, such as a digital still camera or a digital camcorder.

REFERENCE SIGNS LIST 101 first chip
102 second chip
103 bonding surface
104 first substrate
107 multilayer wiring structure
108 second substrate
111 multilayer wiring structure
112 photoelectric conversion element
124 well
125 source/drain region
126 gate electrode of amplification transistor
130 high-melting-metal compound layer

What is claimed is:

1. A photoelectric conversion apparatus comprising:
a first semiconductor layer including a photoelectric conversion element;
a second semiconductor layer including a source region and a drain region of a transistor, the transistor having a gate electrode;
a first multilayer wiring structure disposed between the first semiconductor layer and the second semiconductor layer;
a second multilayer wiring structure disposed such that the second semiconductor layer is disposed between the first multilayer wiring structure and the second multilayer wiring structure; and
a silicide provided on at least one of the gate electrode, the drain region and the source region of the transistor;
wherein the second semiconductor layer has a first face on a side of the first semiconductor layer and a second face on a side opposite to the first face, and
wherein the gate electrode of the transistor is disposed on the side of the second face.

2. The photoelectric conversion device according to claim 1, wherein a wiring electrically connected to the photoelectric conversion element passes through the second semiconductor layer.

3. The photoelectric conversion device according to claim 2, further comprising:
a semiconductor region included in the first semiconductor layer; and
a transfer gate electrode of a transfer transistor disposed between the first semiconductor layer and the second semiconductor layer,
wherein the transfer transistor is configured to transfer a charge generated in the photoelectric conversion element to the semiconductor region, and
wherein the transfer transistor and the wiring are connected to each other.

4. The photoelectric conversion device according to claim 3, further comprising:
a first contact plug disposed between the second semiconductor layer and the second multilayer wiring structure; and
an insulating layer disposed on the second face of the second semiconductor layer,
wherein the silicide includes a first portion and a second portion, the first portion of the silicide is disposed between the first contact plug and the at least one of the gate electrode, the drain region and the source region of the transistor, and
the second portion of the silicide is disposed between a part of the insulating layer and the at least one of the gate electrode, the drain region and the source region of the transistor.

5. The photoelectric conversion apparatus according to claim 1, further comprising:
a microlens,
wherein the first semiconductor layer has a first side and a second side, the first side is opposite to the second side, and the second side faces the second semiconductor layer, and
wherein the microlens is disposed on the first side of the first semiconductor layer.

6. The photoelectric conversion apparatus according to claim 5, further comprising:
a light shielding film provided on the first side of the first semiconductor layer,
wherein the light shielding film is patterned.

7. The photoelectric conversion apparatus according to claim 4, further comprising:
an amplification transistor electrically connected to the semiconductor region and provided in the second semiconductor layer.

8. The photoelectric conversion apparatus according to claim 7, wherein the amplification transistor is a portion of a source follower circuit.

9. The photoelectric conversion apparatus according to claim 4, wherein a part of the second semiconductor layer is in contact with the insulating layer.

10. The photoelectric conversion apparatus according to claim 9, wherein a silicide is not disposed between the first face of the second semiconductor layer and the semiconductor region.

11. The photoelectric conversion apparatus according to claim 10, wherein no metal is in contact with a surface of the first semiconductor layer except for regions where contact plugs are provided.

12. The photoelectric conversion apparatus according to claim 7, wherein the amplification transistor includes a drain region and a source region, and
wherein a part of the drain region of the amplification transistor is in contact with the insulating layer.

13. The photoelectric conversion apparatus according to claim 12, wherein a silicide is not formed on the drain region of the amplification transistor.

14. The photoelectric conversion apparatus according to claim 6, wherein the light shielding film includes a metal different from a metal included in the silicide.

15. The photoelectric conversion apparatus according to claim 14, wherein the silicide includes a cobalt, and the light shielding film includes a tungsten.

16. The photoelectric conversion apparatus according to claim 1, further comprising:
a scan circuit provided in the second semiconductor layer and including the transistor.

17. The photoelectric conversion apparatus according to claim 4, wherein the transistor is configured to supply a signal to the transfer gate electrode.

18. The photoelectric conversion apparatus according to claim 4, further comprising:
a scan circuit provided in the second semiconductor layer and including the transistor,
wherein the scan circuit is configured to supply a signal to the transfer gate electrode.

19. The photoelectric conversion apparatus according to claim 1, further comprising:
an AD conversion circuit provided in the second semiconductor layer and including the transistor.

20. The photoelectric conversion apparatus according to claim 7, further comprising:
an AD conversion circuit provided in the second semiconductor layer and including the transistor,
wherein the AD conversion circuit is configured to process a signal output by the amplification transistor.

21. The photoelectric conversion apparatus according to claim 20, wherein the amplification transistor includes a drain region and a source region, and
a part of the drain region of the amplification transistor is in contact with the insulating layer.

22. The photoelectric conversion apparatus according to claim 1, further comprising:
a first element isolation region provided in the first semiconductor layer; and
a second element isolation region provided in the second semiconductor layer.

23. The photoelectric conversion apparatus according to claim 22, wherein the first element isolation region has a first length in a direction toward which the first semiconductor layer and the second semiconductor layer are arranged,
the second element isolation region has a second length in the direction, and
the first length is larger than the second length.

24. The photoelectric conversion apparatus according to claim 23, wherein the first element isolation region includes a P-type semiconductor region and an insulator.

25. The photoelectric conversion apparatus according to claim 22, wherein the first element isolation region extends from one side of the first semiconductor layer to another side of the first semiconductor layer, and
the first element isolation region reaches both sides of the first semiconductor layer.

26. The photoelectric conversion apparatus according to claim 25, wherein a silicide is not formed on the first element isolation region.

27. The photoelectric conversion apparatus according to claim 1, wherein the first multilayer wiring structure includes a first conductor,
wherein the second multilayer wiring structure includes a second conductor, and
wherein the first conductor and the second conductor are formed of copper.

28. A system comprising:
the photoelectric conversion apparatus according to claim 1; and
a lens which forms an optical image on the photoelectric conversion apparatus.

29. A system comprising:
the photoelectric conversion apparatus according to claim 1; and
a signal processing apparatus that processes a signal output from the photoelectric conversion apparatus.

* * * * *